United States Patent [19]

Hyun et al.

[11] Patent Number: 4,983,546
[45] Date of Patent: Jan. 8, 1991

[54] METHOD FOR CURING SPIN-ON-GLASS FILM BY UTILIZING ULTRAVIOLET IRRADIATION

[75] Inventors: Il S. Hyun; Hae S. Park; Chung G. Choi; Ho G. Ryoo, all of Seoul; Jai O. Koh, Kyungki-Do; Sang I. Kim, Seoul; Sung K. Park, Kyungki-Do; Yung M. Koo, Seoul; Young I. Kim, Seoul; Sea C. Kim, Seoul, all of Rep. of Korea

[73] Assignee: Hyundai Electronics Industries, Co., Ltd., Kyungki, Rep. of Korea

[21] Appl. No.: 453,781

[22] Filed: Dec. 20, 1989

[30] Foreign Application Priority Data

Dec. 20, 1988 [KR] Rep. of Korea .................. 88-17008

[51] Int. Cl.$^5$ ........................................ H01L 21/469
[52] U.S. Cl. ...................................... 437/231; 437/173
[58] Field of Search ..................... 437/231, 228, 173

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 437/231 |
| 4,885,262 | 12/1989 | Ting et al. | 437/228 |
| 4,894,351 | 1/1990 | Batty | 437/229 |
| 4,913,930 | 4/1990 | Getson | 437/228 |

OTHER PUBLICATIONS

Chiang, C. et al, "Defects Study on Spin on Glass Planarization Technology", V—MIC Conf., IEEE Jun. 15-16, 1987, pp. 404-421.
Vines, L. B. et al, "Interlevel Dielectric Planarization with Spin-on Glass Films", V-MIC Conf., IEEE Jun. 9-10, 1986, pp. 506-515.

Primary Examiner—Brian E. Hearn
Assistant Examiner—Trung Dang
Attorney, Agent, or Firm—Merchant, Gould, Smith, Edell, Welter & Schmidt

[57] ABSTRACT

A method for curing spin-on-glass formed on a wafer film which insulates the metal layers and flattens any step difference in the process for manufacturing a multilayered metal layer of a highly integrated semiconductor device which comprises establishing a predetermined initial temperature in a heating chamber with an ultraviolet light source. A wafer, on which a SOG film to be cured is formed, is then introdued into the heated chamber and the temperature gradually increased to a predetermined maximum temperature. The SOG film is irradiated with ultraviolet light at a predetermined wavelength simultaneously with the application of heat at the maximum temperature for a predetermined time. The wafer is then cooled.

6 Claims, 1 Drawing Sheet

METHOD FOR CURING SPIN-ON-GLASS FILM BY UTILIZING ULTRAVIOLET IRRADIATION

BACKGROUND OF THE INVENTION

Field of Invention

This invention relates to a method for curing a spin-on-glass (SOG) film formed on a multi-layered metal layer of a highly integrated semiconductor device, and more particularly, to a method for curing a SOG film by ultraviolet ray irradiation of the SOG film formed on a multi-layered metal layer of the semiconductor device.

When a multi-layered metal layer in the semiconductor device above 1 mega byte is manufactured, a SOG film is formed in order to flatten step differences and to insulate the metal layers from one another. However, since SOG film has a property such as a polymer and does not have as much insulating property as desired, SOG has to be cured through a curing process so as to improve the insulating property.

Accordingly, the curing process in the prior art is performed by infrared heat treatment in a furnace. This process is actually implemented in such a manner that a first heat treatment is performed in a hot plate for 1 minute at a temperature of 180° C. The second heat treatment is then performed in the furnace for 30 minutes at a temperature of 420° C., thereby obtaining an improvement of the insulating property of the SOG film which is required for a highly integrated semiconductor device.

However, heat treatment of the SOG film in accordance with the prior art method results in the occurrence of cracks inside the SOG film, thereby deteriorating the insulating property. Also, as result of the heat treatment in the furnace, contamination occurs in the semiconductor device and damage occurs to other layers under SOG film.

Since a plurality or batch of wafers are placed in a processing apparatus, the entire batch wafers may be damaged if the apparatus has an operational failure.

Therefore, it is an object of the present invention to provide a method for curing the SOG film which can eliminate the formation of cracks which result in deterioration of the insulating property of the cured SOG film.

Specifically, it is an object of the present invention to provide a method for uniformly curing the SOG film in which the method comprises performing ultraviolet ray irradiation to the top of the SOG film simultaneously with performing indirect heat treatment to the SOG film by applying heat to the bottom of the wafer.

According to an aspect of the present invention, it is possible to protect SOG film against cracking by applying lower heat than that in the furnace in accordance with the prior art method, thereby improving the insulating property of SOG film.

According to the another aspect of the present invention, it is possible to cure the SOG film uniformly by the ultraviolet ray irradiation on the top of SOG film, thereby providing the preferred cured SOG film.

SUMMARY OF THE INVENTION

The present invention relates to a method for curing spin-on-glass (SOG) formed on a wafer film in order to insulate the metal layers and to level or flatten step difference in the process for manufacturing a multilayered metal layer of a highly integrated semiconductor device. The process according to the present invention comprises establishing a predetermined initial temperature in a heating chamber which includes an ultraviolet light source. A wafer on which a uv light-heat curable SOG film is formed, is positioned into the heated chamber and the temperature is gradually increased to a predetermined maximum temperature. The curable SOG film is irradiated with ultraviolet light at a predetermined wavelength simultaneously with the application of heat at the maximum temperature for a predetermined time. The wafer is then cooled to a final temperature.

Preferably, the predetermined initial temperature in the chamber is set to 200° C. Also, it is preferred that the predetermined initial temperature is gradually increased to the predetermined maximum temperature by gradually increasing the temperature from 200° C. to 240° C. over a period of 30 seconds.

Irradiation of the SOG film is preferably performed with an ultraviolet ray having a predetermined wavelength of 300 nm in the chamber simultaneously with curing the SOG film at the maximum temperature of 240° C. for a predetermined duration of time of 120 seconds. The wafer is then cooled to the predetermined temperature of perferably about 130° C. by gradual cooling.

BRIEF DESCRIPTION OF THE DRAWINGS

For a better understanding of the nature and objects of the invention, reference should be made to the following detailed description taken in conjunction with the accompanying drawings in which.

The novel feature of the present invention may be understood from the accompanying description when taken in conjunction with the accompanying drawing.

DETAILED DESCRIPTION

Figure 1:
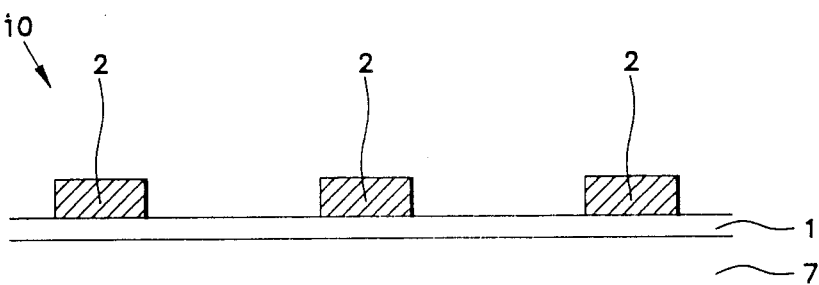
FIG. 1 illustrates a cross-section of a silicon wafer in which a first metal layer is formed on a portion of the insulating layer on a silicon substrate.

FIG. 1 illustrates a cross-section of a silicon wafer 10 in which an insulating material 1 is deposited on a silicon substrate 7 and a first metal layer 2 is then formed on the insulating layer 1. Then, a portion of the first metal layer 2 is removed by the mask pattern process.

Figure 2:
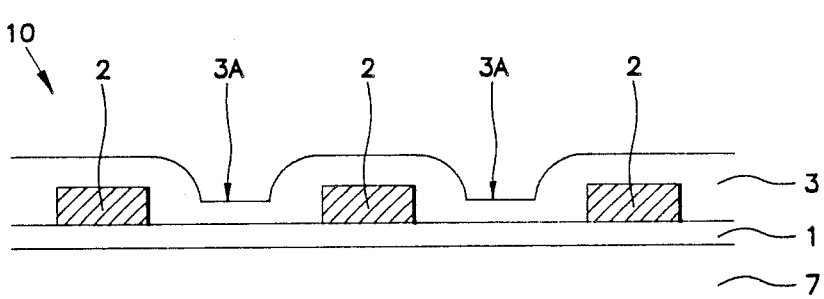
FIG. 2 illustrates a cross-section of a silicon wafer in which a first LTO (Low Temperature Oxide) film is formed as a first insulating layer on the structure shown in FIG. 1.

FIG. 2 illustrates a cross-section of a silicon wafer in which a first LTO film 3 is formed as a first insulating layer on the first metal layer and a portion of the insulating material on which there is deposited to the uniform thickness, a plurality of grooves 3A are formed in the first LTO film 3 positioned between the segments of the first metal layer 2 as shown in FIG. 2.

Figure 3:
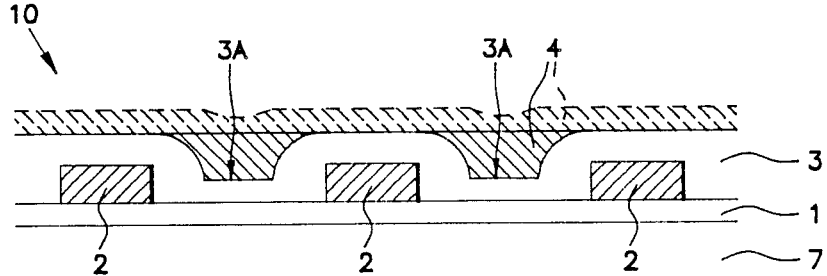
FIG. 3 illustrates a cross-section of a silicon wafer in which the SOG film formed on the first LTO film is removed except for the portion positioned in the groove in order to make the top surface of the first LTO film flat.

FIG. 3 illustrates a cross-section of silicon wafer 10 in which the SOG film 4 is formed on the first LTO film 3 as desired thickness and a portion 4A of the SOG film 4 is removed by the particial etch back except for the portion positioned in the groove 3A in order to make the top surface of the structure flat, i.e. smooth.

Figure 4:
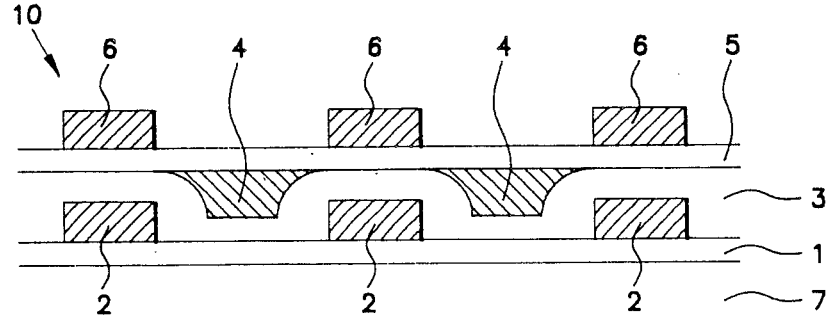
FIG. 4 illustrates a cross-section of a silicon wafer in which a second insulating layer is formed as a second insulating layer on the structure shown in FIG. 3 and a second LTO layer is then formed a portion of the second LTO layer.

FIG. 4 illustrates a silicon wafer 10 in which a second LTO film 5 is formed on SOG film 4 and the first LTO film 3 of the structure shown in FIG. 3, and a second metal layer 6 is deposited on the second LTO film 5 and with a portion of the second metal layer 6 having been removed by the mask pattern process.

As described above, when the metal layer is formed by a plurality of layers, an insulating layer 3 is formed to the uniform thickness on the metal layers 2 and the insulating layer 1. Then, a SOG film 4 is formed on the insulating layer 3 and a portion 4A of the SOG film 4 also is removed leaving a portion thereof in the groove 3A in order to flatten or smooth the top surface as shown in FIG. 3. As a result of planarization step described above, the second LTO film 5 can be directly formed on the insulating layer 3 and on the SOG film 4.

FIGS. 1 to 4 illustrate a process for forming a semiconductor device and explain a method of heat treatment according to the present invention in which the ultraviolet ray irradiation is performed on the SOG film 4. This invention relates to a method for curing the silicon wafer 10, for curing the SOG film 4 formed on the silicon wafer 10 as shown in FIG. 3.

Accordingly, a method for curing SOG film 4 according to the present invention will be described hereinafter.

The description of the method for curing SOG 4 will be provided in reference to tables given below in which values in the tables are obtained by changing several conditions.

TABLE 1-A (The etching rate of SOG film depending on the predetermined temperature in the chamber.)

| predetermined temperature in the chamber (°C.) | 180 | 180 | 180 |
|---|---|---|---|
| maximum temperature in the chamber (°C.) | 200 | 220 | 240 |
| etching rate (Å/minutes) | 1100 | 982 | 750 |

TABLE 1-B

| predetermined temperature in the chamber (°C.) | 190 | 190 | 190 |
|---|---|---|---|
| maxium temperature in the chamber (°C.) | 200 | 220 | 240 |
| etching rate (Å/minutes) | 1050 | 810 | 690 |

TABLE 1-C

| predetermined temperature in the chamber (°C.) | 200 | 200 | 200 |
|---|---|---|---|
| maximum temperature in the chamber (°C.) | 200 | 220 | 240 |
| etching rate (Å/minutes) | 700 | 670 | 624 |

The tables 1-A to 1-C show that the etching rate of SOG film 4 is measured after SOG film 4 is cured by changing the maximum temperature in the chamber of the curing apparatus, while the predetermined temperature remains constant. A 50:1 (NH$_4$F:HF) buffered oxide etchant (BOE) solution is utilized for etching the SOG film 4.

The predetermined temperature in the chamber listed in Table 1-A, which means the temperature of the chamber before the SOG film 4 is placed into the chamber, is 180° C. After the SOG film has been placed in the chamber, the temperature is increased to 200° C., 220° C. and 240° C., respectively and the etching rate is measured for each maximum temperature in the chamber. As illustrated, the lower etching rate (Angstroms per minute) is obtained if the higher curing temperature is applied.

The predetermined temperature in the chamber in the Table 1-B is 190° C. before SOG film 4 is placed therein. After SOG film 4 is placed into the chamber, the maximum temperature is increased for each maximum temperature in the chamber. As can be seen from Table 1-B, the etching rate decreased relative to that expressed in Table 1-A.

The predetermined temperature in the chamber in the Table 1-C is 200° C. before the SOG film 4 is placed into the chamber. After SOG film 4 has been placed into the chamber, the maximum temperature is increased to 200° C., 220° C. and 240° C., respectively and the etching rate is measured for each maximum temperature in the chamber. As can be seen from Table 1-C, the higher temperature in the chamber, the lower etching rate is obtained. It should be noted that lower etching rate means that a preferred cure of SOG film 4 is achieved.

TABLE 2

(The time for curing the wafer is varied while the maximum temperature is maintained at a constant.)

| maxium temperature in the chamber (°C.) | 240 | 240 | 240 | 240 |
|---|---|---|---|---|
| timing for curing (second) | 30" | 1'30" | 2' | 3' |
| etching rate (Å/minutes) | 1020 | 912 | 624 | 320 |

Table 2 shows that the etching rate of the SOG film 4 is measured after SOG film 4 is cured by changing the curing time for the wafer 10 while the maximum temperature in the curing apparatus utilizing ultraviolet ray irradiation is maintained constant. Table 2 illustrates that the longer the curing time, the lower the etching rate. Accordingly, if SOG film 4 is cured at the maximum temperature for 2 minutes, it is found that the optimized cure is achieved. That is, though, etching rate for curing time of 3 minutes is lower than etching rate for curing time of 2 minutes, the desired curing state is achieved for curing time of 2 minutes.

TABLE 3

(The contraction rate when the maximum temperature is varied.)

| predetermined temperature in the chamber (°C.) | 200 | 200 | 200 |
|---|---|---|---|
| maximum temperature in the chamber (°C.) | 200 | 220 | 240 |
| contracting rate (%) | 4.9 | 4.2 | 3.6 |

TABLE 4

(The contraction rate when the curing time is varied.)

| curing time (second) | 30" | 1' | 1'30" | 2' | 3' |
|---|---|---|---|---|---|
| contraction rate (%) | 8.7 | 7.2 | 5.2 | 3.6 | 2.4 |

Table 3 shows a contraction rate of SOG film 4 when the maximum temperature for curing SOG film 4 is varied. As can be seen from Table 3, when the maximum temperature is maintained at 240° C., the contraction rate of SOG film 4 is lower than those at other temperatures.

Table 4 shows a contraction rate of SOG film 4 obtained by changing the curing time for the wafer 10 while maintaining the maximum temperature in the chamber constant. As the curing time increases, the contraction rate of SOG film 4 decreases. However, according to the present invention, the curing time at the maximum temperature is determined to 2 minutes considering the processing time and the state of SOG film.

Since there was a limitation to the curing apparatus in the experiment, it was not possible to obtain further values for higher temperature. However, it is possible to obtain an optimum condition from the comparison of tables.

Accordingly, a curing process for SOG film 4 utilizing the optimum condition obtained above will be described.

A wafer 10 on which the SOG film is formed is introduced by a transfer device into the chamber of a curing apparatus which includes an ultraviolet high source for UV irradiation. The temperature in the chamber is 200° C. before SOG film is introduced. At this moment, the increase in temperature is gradually implemented. The introduced wafer 10 is heated at the maximum temperature of 240° C. for 30 seconds. When the temperature reaches 240° C., radiation of ultraviolet rays having a specific wavelength (for example, 300 nm from ultraviolet (UV) lamp) is performed on the top of the wafer 10 for 120 seconds, that is, UV curing process is performed. The wafer 10 is maintained at 240° C. for 120 seconds, whereby the SOG film 4 on the wafer 10 is cured by thermal energy and UV light energy. The light source of the ultraviolet ray is turned off and the temperature in the chamber is lowered to 130° C. The wafer 10 is transferred out of the chamber.

In the method for curing SOG film 4, the factors which must be critically controlled are the selection of wavelength, maintenance of temperature in the chamber and the increasing rate of temperature, the maximum temperature and the decreasing rate of temperature. Accordingly, depending upon the selection of the above factors, the degree of the cure of SOG film 4 can be controlled.

The result of the comparison of SOG film 4 cured in the prior art furnace with that cured according to the method described above is provided below at Table 5.

TABLE 5

(The comparison of the etching rates of the LP (Low Pressure) oxide film with that of SOG film 4 in the 100:1 (Deionized water:HF) solution.)

| type | before etching | after etching | difference between films thickness | etching rate |
|---|---|---|---|---|
| LP oxide film | 3333 Å | 3054 Å | 279 Å | 2.8 Å/sec |
| SOG film | 1311 Å | 1175 Å | 136 Å | 1.36 Å/sec |

From Table 5, the degree of cure of SOG film 4 can be evaluated by comparing the etch rate of the SOG film and the LP oxide film. It is found that the etch-rate of SOG film is lower than that of LP oxide film. It means that the UV-Cured SOG film is denser than the LP oxide film.

TABLE 6

(The comparison of the etching rate by the $CHF_3/C_2F_6$/He plasma etching.)

| type | before etching | after etching | etching rate |
|---|---|---|---|
| present invention | 1245 Å | 798 Å | 44.7 Å/sec |
| prior art | 1190 Å | 740 Å | 45.7 Å/sec |

The conditions of the method according to the present invention: The wafer 10 on which SOG film 4 is formed is subject to the curing process in the hot plate at 180° C. for 1 minute and is then subject to the UV curing process at 240° C. for 2 minutes in the curing apparatus utilizing ultraviolet radiation.

The conditions in the prior art method: The wafer 10 on which SOG film 4 is formed is subject to the curing process in the hot plate at 180° C. for 1 minute and is then subject to the curing process in the furnace at 420° C. for 30 minutes.

Table 6 shows the result of the comparison of the etching rate of SOG film 4 which is subject to the dry etching with ($CHF_3/C_2F_6$/He) plasma and it was found that the etching rate according to the present invention and the etching rate according to the prior art method are substantially same.

TABLE 7

(The etching rate by oxygen plasma)

| type | before etching | after etching | etching rate |
|---|---|---|---|
| present invention | 1208 Å | 1193 Å | 0.43 Å/sec |
| prior art | 1208 Å | 1195 Å | 0.43 Å/sec |

Table 7 shows the result of the comparison of the etching rate of SOG film 4 which is subject to dry etching with oxygen plasma and it was found that the etching rate according to the present invention and the etching rate according to the prior art method are substantially same. Thus, it can be seen that the degree of cure of SOG film is substantially same.

TABLE 8

(S.O.G. film contracting rate)

| type | before etching | after etching | contracting rate |
|---|---|---|---|
| present invention | 1342 Å | 1313 Å | 2.2% |
| prior art | 1342 Å | 1269 Å | 6.3% |

Table 8 shows the result of the contraction rate of SOG film 4 and, more specifically, it provides the comparison of the contraction rate between a SOG film 4 cured by the UV curing method according to the present invention and an SOG film 4 cured in the prior art furnace. It should be noted that the lower the contraction rate of area of the SOG film 4 is, the more preferable.

As described above, the prior art method utilizes only thermal energy, but since the curing method according to the present invention utilizes light energy resulting from ultraviolet irradiation simultaneously with the thermal energy, the insulating property of the SOG film 4 is improved and also the film integrity is maintained by preventing the occurrence of cracks in the film. Therefore, the loss of wafers due to the inadequacy of the prior art process can be minimized and a more reliable semiconductor device can be attained so that such devices can be more economically produced.

The foregoing description of the preferred embodiment has been presented for the purpose of illustration and description. It is not intended to limit the scope of this invention. Many modifications and variations are possible in the light of the above teaching. It is intended that the scope of the invention be defined by the claims.

What is claimed is:

1. A method for curing SOG a spin-on-glass formed on a wafer film which is formed in order to insulate the metal layers from each other and to flatten the step difference in the process for manufacturing a multilayered metal layer of a highly integrated semiconductor device comprising:
    establishing in a heating chamber which includes an ultraviolet light source a predetermined initial temperature;
    introducing a wafer, on which a SOG film to be cured is formed, into the heated chamber and increasing the temperature gradually to a predetermined maximum temperature;
    irradiating the SOG film with ultraviolet light at a predetermined wavelength while maintaining the maximum temperature for a predetermined time; and
    cooling the wafer.

2. The method of claim 1 wherein the predetermined maximum temperature in the chamber is set to 200° C.

3. The method of claim 1 wherein the predetermined initial temperature is gradually increased to the predetermined maximum temperature by gradually increasing the temperature from 200° C., to 240° C. over a period of 30 seconds.

4. The method of claim 1 wherein the predetermined maximum temperature is 240° C., the predetermined duration of time is 120 seconds and the predetermined wavelength is 300nm.

5. The method of claim 1 wherein the wafer is cooled in the chamber to a final temperature of 130° C.

6. A method for curing SOG a spin-on-glass formed on a wafer film which is formed in order to insulate the metal layers from each other and to flatten the step difference in the process for manufacturing a multi-layered metal layer of a highly integrated semiconductor device comprising:
    establishing in a heating chamber which includes an ultraviolet light source a predetermined initial temperature of 200° C.;
    introducing a wafer, on which a SOG film to be cured is formed, into the heated chamber and increasing the temperature gradually over a period of 30 seconds to a predetermined maximum temperature of 240° C.;
    irradiating the SOG film with ultraviolet light at a predetermined wavelength of 300 nm while maintaining the maximum temperature at 240° C. for a predetermined time of 120 seconds; and
    cooling the wafer to a final temperature in the chamber of 130° C.

* * * * *

UNITED STATES PATENT AND TRADEMARK OFFICE
CERTIFICATE OF CORRECTION

PATENT NO.  : 4,983,546

DATED       : January 8, 1991

INVENTOR(S) : Il Sun Hyun et al.

It is certified that error appears in the above-identified patent and that said Letters Patent is hereby corrected as shown below:

Title Page:
In the Abstract, line 8, "introdued" should read --introduced--.

Column 3, line 47, Table 1 B, "maxium" should read --maximum--.

Column 4, line 30, Table 2, "maxium" should read --maximum--.

Column 6, line 32, "1208 $\overset{\circ}{A}$" should read --1206 $\overset{\circ}{A}$--.

Signed and Sealed this

Thirtieth Day of June, 1992

Attest:

DOUGLAS B. COMER

*Attesting Officer*     *Acting Commissioner of Patents and Trademarks*